United States Patent [19]

Ueno et al.

[11] Patent Number: 4,801,983
[45] Date of Patent: Jan. 31, 1989

[54] SCHOTTKY DIODE FORMED ON MOSFET DRAIN

[75] Inventors: Masahiro Ueno; Masahiro Iwamura; Kozaburo Kurita; Ikuro Masuda, all of Hitachi, Japan

[73] Assignee: Hitachi, Ltd., Tokyo, Japan

[21] Appl. No.: 899,399

[22] Filed: Aug. 22, 1986

[30] Foreign Application Priority Data

Aug. 30, 1985 [JP] Japan .................................. 60-189643

[51] Int. Cl.⁴ ...................... H01L 27/04; G11C 11/40
[52] U.S. Cl. ..................................... 357/15; 357/23.1; 357/23.3; 357/41; 357/45; 307/446; 307/465; 307/469; 340/825.96; 365/104
[58] Field of Search ....................... 357/15, 23.1, 23.3, 357/41, 45; 365/104; 340/825.91, 825.94, 825.96; 307/446, 465, 469

[56] References Cited

U.S. PATENT DOCUMENTS

| | | | |
|---|---|---|---|
| 3,686,644 | 8/1972 | Christensen | 357/15 |
| 3,770,606 | 11/1973 | Lepselter | 357/15 |
| 3,788,904 | 6/1974 | Haraszti | 357/15 |
| 4,432,073 | 2/1984 | Mgsuoka | 365/104 |

FOREIGN PATENT DOCUMENTS 56-15067 2/1981 Japan .
58-222620 12/1983 Japan .

Primary Examiner—William D. Larkins
Attorney, Agent, or Firm—Antonelli, Terry & Wands

[57] ABSTRACT

A unidirectional switching circuit having no charge storage effect for performing a high-speed switching operation is disclosed in which one of the anode and cathode terminals of a Schottky-barrier diode is connected to one of the source and drain terminals of a field effect transistor to form the series combination of the Schottky-barrier diode and the field effect transistor, that one of end terminals of the series combination which exists on the anode side of the diode, is used as an input terminal, the other end terminal existing on the cathode side is used as an output terminal, the gate electrode of the field effect transistor is used as a switching control electrode, and a current flowing through the switching circuit in a direction from the input terminal to the output terminal is controlled in accordance with a signal applied to the switching control electrode.

2 Claims, 8 Drawing Sheets

FIG. 7B

| INPUT\OUTPUT | | E1 | E2 | E3 |
|---|---|---|---|---|
| D1 | A1 | 1 | 0 | 1 |
| | A2 | 1 | 0 | 1 |
| | A3 | 0 | 1 | 1 |
| D2 | A1 | 0 | 0 | 0 |
| | A2 | 1 | 0 | 1 |
| | A3 | 0 | 0 | 0 |
| D3 | A1 | 0 | 1 | 1 |
| | A2 | 1 | 0 | 1 |
| | A3 | 1 | 1 | 0 |

SCHOTTKY DIODE FORMED ON MOSFET DRAIN

BACKGROUND OF THE INVENTION

The present invention relates to a switching circuit, and more particularly to a unidirectional switching circuit capable of performing a high-speed operation.

A field effect transistor (hereinafter referred to as "FET" or "MOS transistor") can act as a switching element which is small in size and low in power consumption, and is suitable for use in a high-density semiconductor integrated circuit. For example, the FET is used as a switching element in a programmable logic array (hereinafter referred to as "PLA"). However, the FET is a bi-directional switching element, and hence it is difficult to form a complicated multi-logic circuit of FET's while satisfying the regularity required for a large scale integration circuit. An example of a PLA using FET's is disclosed in Japanese patent Publication No. JP-A-58-222620. In such an ordinary PLA, one or both of an AND array and an OR array are arranged separately from a main circuit, and an AND operation and an OR operation are performed in the AND array and the OR array, respectively. Since each of the AND array and OR array can perform only a limited logical function, each array is required to have a large number of row lines and column lines each corresponding to a logical product or logical sum, and to provide many of logic circuits externally of the PLA.

While, a static-type semiconductor memory cell including a switching circuit which is made up of an FET and a Schottky-barrier diode, is disclosed in Japanese patent Publication No. JP-A-56-15067. In more detail, the above memory cell includes both a memory circuit formed of a flip-flop circuit, and a Schottky-barrier diode for connecting the memory circuit to a bit line. However, the memory circuit is connected to and disconnected from the bit line, by varying the potential of the ground line of the flip-flop circuit. This ground line is connected to the source electrode of an FET for forming the flip-flop circuit, and hence is connected to an equivalent load which is made up of both a definite input impedance of the FET viewed from the source side thereof and the parasitic capacitance at the above source electrode due to the substrate and gate of the FET. Accordingly, when the memory circuit is connected to or disconnected from the bit line, a large amount of power is required to drive the ground line. Further, the memory cell cannot perform a highspeed switching operation, because the equivalent load circuit has a large capacitive component based upon the above parasitic capacitance, and because the potential of the cathode of the Schottky-barrier diode is controlled through the memory circuit having a relatively high impedance.

SUMMARY OF THE INVENTION

An object of the present invention is to provide a switching circuit which is high in control input impedance and low in power consumption and can perform a switching operation at a high speed, and in which a current can flow only in one direction.

Another object of the present invention is to provide a unidirectional switching circuit which has the above-mentioned characteristic features and moreover is suitable for use in a large scale integration circuit.

In order to attain the above objects, according to the present invention, there is provided a switching circuit in which one of the anode and cathode terminals of a Schottky-barrier diode is connected to one of the source and drain terminals of an FET to form a series combination of the diode and the FET, that one of end terminals of the series combination which exists on the anode side of the diode, is used as an input terminal, the other end terminal existing on the cathode side of the diode is used as an output terminal, and the gate terminal of the FET is used as a switching control terminal. This switching circuit is a unidirectional circuit which allows a current to flow only in a direction from the input terminal toward the output terminal. Moreover, the switching circuit has no charge storage effect, and hence can perform a switching operation at a high speed.

The other objects and features of the present invention will be apparent from the following detailed explanation of embodiments.

BRIEF DESCRIPTION OF THE DRAWINGS

FIG. 7B shows the truth table of the diode array of FIG. 7A.

DESCRIPTION OF THE PREFERRED EMBODIMENTS

Figure 1:
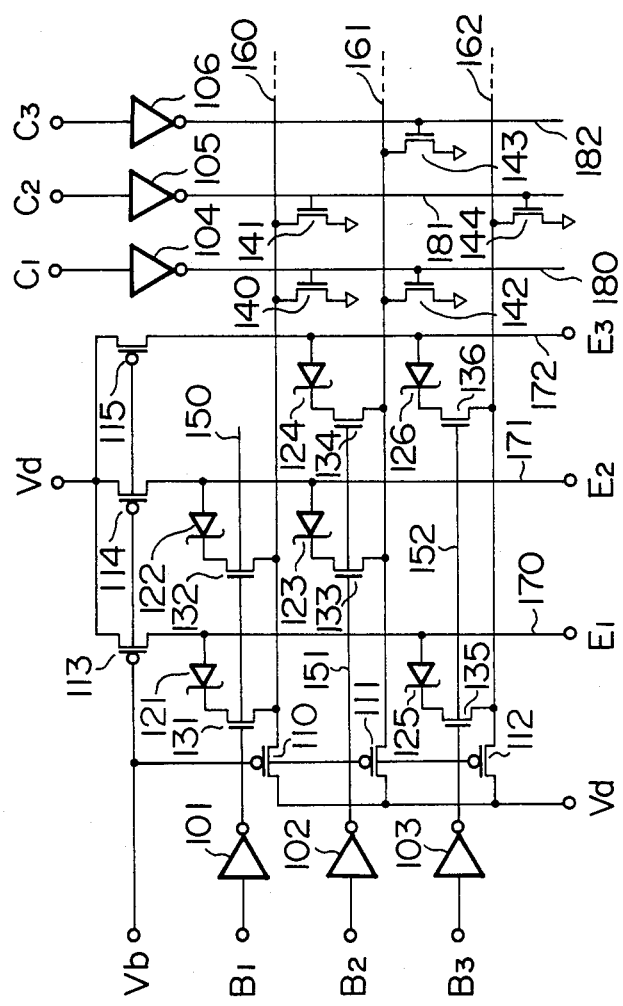
FIG. 1 is a circuit diagram showing an embodiment of a PLA according to the present invention.

FIG. 1 shows an embodiment of a PLA according to the present invention. Needless to say, a PLA is one of semiconductor matrix circuits. In FIG. 1, reference numerals 101 to 106 designate inverters each formed of complementary MOS transistors or made up of a bipolar transistor and a MOS transistor. The outputs of the inverters 101 to 103 are connected to first row lines 150 to 152 and the outputs of the inverters 104 to 106 are connected to first column lines 180 to 182, respectively. 110 to 115 designate PMOS transistors, 121 to 126 Schottky-barrier diodes (hereinafter referred to as "Schottky diodes"), 131 to 136 NMOS transistors, and 140 to 144 NMOS transistors. As shown in FIG. 1, the Schottky diodes 121 to 126 are connected in series with the NMOS transistors 131 to 136, respectively, to form a plurality of unidirectional switching circuits, each of which is disposed at a desired one of the connecting points of second column lines 170 to 172 and the first row lines 150 to 152. Further, in FIG. 1, reference symbol $V_d$ designates a first power source, $V_b$ a bias source, $B_1$ to $B_3$ first input signals, $C_1$ to $C_3$ second input signals, and $E_1$ to $E_3$ output signals.

Referring to FIG. 1, respective anodes of the Schottky diodes 121 to 126 are connected to one of the second column lines 170 to 172, and respective gate electrodes of the NMOS transistors 131 to 136 are connected to one of the first row lines 150 to 152. Further, respective source electrodes of the NMOS transistors 131 to 136 are connected to one of second row lines 160 to 162, which are connected to the first power source $V_d$ through the PMOS transistors 110 to 112. The cathodes of the Schottky diodes 121 to 126 are connected to the drain electrodes of the NMOS transistors 131 to 136, respectively.

Next, explanation will be made of the operation of the PLA having the above-mentioned circuit configuration. The PMOS transistors 110 to 112 serve to make high the levels of the second row lines 160 to 162, and the PMOS transistors 113 to 115 serve to make high the levels of the second column lines 170 to 172. Thus, at an initial state, each of the output signals $E_1$ to $E_3$ takes a high level. Now, let us suppose that, at the initial state, the first input signals $B_1$ to $B_3$ and the second input signals $C_1$ to $C_3$ take a high level, and thus the first row lines 150 to 152 and first column lines 180 to 182 are all kept at a low level. That is, the NMOS transistors 131 to 136 and 140 to 144 are all put in an OFF-state.

Next, let us consider an operating state that the input signals $B_2$, $B_3$ and $C_2$ are changed to a low level. At this time, the NMOS transistors 133, 134, 135, 136, 141 and 144 are turned on, and thus the parallel combination of the NMOS transistors 135 and 136 is connected in series with the NMOS transistor 144 through the second row line 162. Hence, the electric charge on the second row lines 170 and 172 is removed to ground, and thus the output signals $E_1$ and $E_3$ take a low level. As mentioned above, when that one of the NMOS transistors 131 to 136 belonging to a first transistor array which has been turned on by one of the first row lines 150 to 152, is connected in series with that one of the NMOS transistors 140 to 144 belonging to a second transistor array which has been turned on by one of the first column lines 180 to 182, that one of the second column lines 170 to 172 which is connected to the above series circuit, takes a low level. That is, a logical operation is performed. Relations between the input signals $B_1$ to $B_3$ and $C_1$ to $C_3$ and the output signals $E_1$ to $E_3$ are given by the following logical equations:

$$\overline{E_1} = \overline{B_1} \cdot (\overline{C_1} + \overline{C_2}) + \overline{B_3} \cdot \overline{C_2}$$

$$\overline{E_2} = \overline{B_1} \cdot (\overline{C_1} + \overline{C_2}) + \overline{B_2} \cdot (\overline{C_2} + \overline{C_3})$$

$$\overline{E_3} = \overline{B_2} \cdot (\overline{C_1} + \overline{C_2}) + \overline{B_3} \cdot \overline{C_2}$$

Now, let us consider the above operation for a case where the Schottky diodes 120 to 126 are omitted from the PLA of FIG. 1, to clarify the function of each Schottky diode. Similarly to the case where the Schottky diodes 121 to 126 exist, the output signals $E_1$ and $E_3$ take the low level. However, the output signal $E_2$ is erroneously put to the low level for the following reason. The second column line 172 kept at the low level is connected to the second row line 161 through the turned-on NMOS transistor 134, and thus the second row line 161 is put to the low level. Further, the second row line 161 is connected to the second column line 171 through the turned-on NMOS transistor 133, and thus the second column line 171 is put to the low level. As a result, the output signal $E_2$ takes the low level. That is, when the Schottky diodes are omitted, an erroneous logical operation is performed. In other words, the Schottky diodes 121 to 126 prevent the back flow of current, to perform a correct logical operation.

As is evident from the above explanation, in the present embodiment, a plurality of unidirectional switching circuits each made up of one of the Schottky diodes 121 to 126 and a corresponding one of the NMOS transistors 131 to 136 are combined with the NMOS transistors 140 to 144, to perform a complicated logical operation.

In the present embodiment, the number of first row lines, the number of second row lines, the number of first column lines and the number of second column lines are all made equal to three. The present invention is not limited to such a case, but is applicable to a PLA having a desired number of row lines and column lines. Further, the PMOS transistors and the NMOS transistors may be arranged in a manner different from that shown in FIG. 1. Furthermore, in order to perform a multiphase operation the phases of the input signals and the bias voltage can be controlled by a timing pulse signal, without departing from the gist of the present invention.

Figure 2:
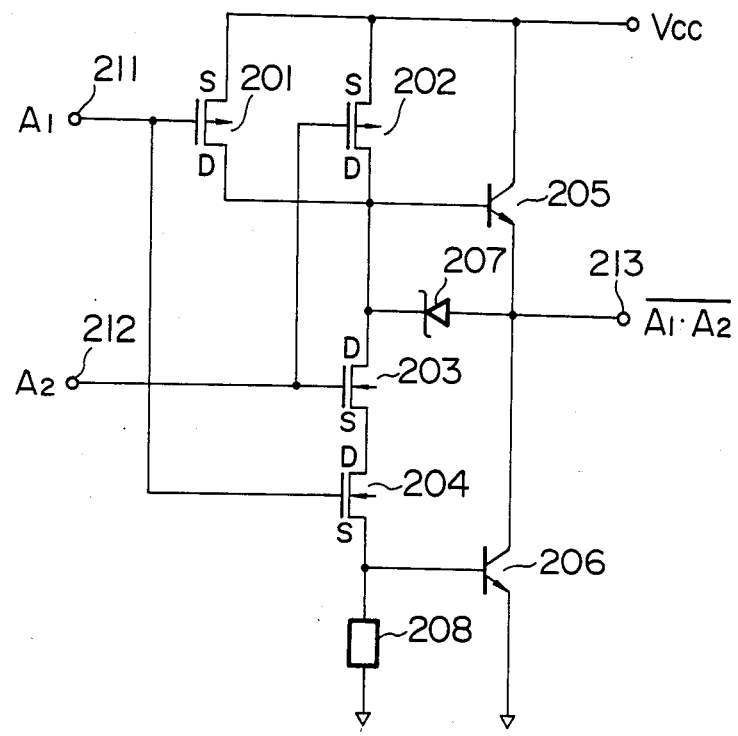
FIG. 2 is a circuit diagram showing an embodiment of a logic circuit according to the present invention.

FIG. 2 shows an embodiment of a logic circuit according to the present invention. The present embodiment is a two-input NAND gate circuit which is an example of a composite logic circuit including a bipolar transistor and a complementary MOS, and hence has both the large-load driving capability of the bipolar transistor and the low power consumption characteristic of the complementary MOS.

Referring to FIG. 2, the source electrodes of PMOS transistors 201 and 202 are connected to a power source $V_{CC}$, and the drain electrodes of the transistors 201 and 202 are connected to the base of an NPN transistor 205, to form the same PMOS transistor circuit as in the conventional two-input NAND gate circuit including a complementary MOS. Further, NMOS transistors 203 and 204 are connected in series, and the drain electrode of the transistor 203 and the source electrode of the transistor 204 are connected to the base of the NPN transistor 205 and the base of an NPN transistor 206, respectively, to form the same NMOS transistor circuit as in the conventional two-input NAND gate circuit including a complementary MOS. The collector of the NPN transistor 205 is connected to the power source $V_{CC}$, and the emitter of the NPN transistor 205 is connected directly to the collector of the NPN transistor 206 and an output terminal 213. Further, the emitter of the NPN transistor 206 is grounded.

The anode of a Schottky diode 207 is connected to the emitter of the NPN transistor 205 and the output terminal 213, and the cathode of the diode 207 is connected to the base of the NPN transistor 205. Further, an input terminal 211 is connected to the gate electrodes of the PMOS transistor 201 and the NMOS transistor 204, and another input terminal 212 is connected to the gate electrodes of the PMOS transistor 202 and the NMOS transistor 203. Discharge means (namely, a discharge circuit or discharge element) 208 formed of a resistor for removing the electric charge on the base of the NPN transistor 206 to ground is provided as shown in FIG. 2.

Next, the operation of the present embodiment will be explained. In a case where at least one of input signals $A_1$ and $A_2$ takes a level "0", at least one of the NMOS transistors 203 and 204 is turned off, and at least one of the PMOS transistors 201 and 202 is turned on. Thus, a base current flows into the NPN transistor 205, and the transistor 205 is turned on. As a result, a load which is connected to the output terminal 213 but is not shown in FIG. 2, charges up, and thus an output signal takes a level "1". The Schottky diode 207 which is connected between the output terminal 213 and the base of the NPN transistor 205, plays an important role. That is, at the time the output signal is changed from the level "0" to the level "1", the Schottky diode 207 is reverse-biased, and hence the whole current from the PMOS transistors 201 and/or 202 is used as the base current of the NPN transistor 205.

In a case where both of the input signals $A_1$ and $A_2$ take the level "1", the PMOS transistors 201 and 202 are turned off, and the NMOS transistors 203 and 204 are turned on. Accordingly, a base current flows from the output terminal 213 to the NPN transistor 206 through the Schottky diode 207 and the NMOS transistors 203 and 204. As a result, the NPN transistor 206 is turned on, and the electric charge on the load which is connected to the output terminal 213, flows to the ground through the NPN transistor 206. Thus, the output signal takes the level "0". At the same time as the above operation, the parasitic capacitance with respect to the base of the NPN transistor 205 discharges through the NPN transistors 203 and 204. Accordingly, the NPN transistor 205 is rapidly turned off. The characteristic feature of the present embodiment resides in that the Schottky diode 207 is connected between the output terminal 213 and the base of the NPN transistor 205, and hence the NMOS transistors 203 and 204 have a function of obtaining the logical product of the input signals $A_1$ and $A_2$ and another function of removing the electric charge which has been stored on the base of the NPN transistor 205.

In order to make high the operating speed of the present embodiment and to make low the power consumption thereof, it is necessary to make the parasitic capacitance with respect to the base of the NPN transistor 205 as small as possible. It is most effective in reducing the above parasitic capacitance to make small the capacitance between the Schottky diode and the substrate thereof.

Although the present embodiment provides a two-input NAND circuit, the present invention is also applicable to k-input NAND circuits such as a three-input NAND circuit and a four-input NAND circuit. In this case, k PMOS transistor such as the transistors 201 and 202 are connected in parallel, k NMOS transistors such as the transistors 203 and 204 are connected in series, and the gate electrode of each PMOS transistor and the gate electrode of each NMOS transistor are connected to a corresponding one of k input terminals. Further, the present invention is not limited to the k-input NAND circuit, but is applicable to a k-input NOR circuit or an inverter circuit. In the case of the k-input NOR circuit, k PMOS transistors such as the PMOS transistors 201 and 202 of FIG. 2 are connected in series, and k NMOS transistors such as the NMOS transistors 203 and 204 of FIG. 2 are connected in parallel. In the case of the inverter circuit, one of the PMOS transistors 201 and 202 and one of the NMOS transistors 203 and 204 are omitted from the present embodiment. In other word, the inverter circuit corresponds to the k-input NAND circuit or k-input NOR circuit in which the value of k is equal to one.

In a different point of view, the present embodiment of FIG. 2 is considered to be a bipolar transistor-complementary field effect transistor composite circuit comprising: a pair of first and second bipolar transistors each having a collector of a first conductivity type, a base of a second conductivity type and an emitter of the first conductivity type, said bipolar transistors being connected in series between first and second potential sources, the connection node of the collector-emitter current paths of the bipolar transistors being used as an output terminal of the composite circuit; a field effect transistor of the second conductivity type responsive to a predetermined input for forming a path from the first potential source to the base of the first bipolar transistor, to output a signal for putting the first bipolar transistor in an ON- or OFF-state; a field effect transistor of the first conductivity type responsive to the predetermined input for forming a path from at least the base of the first bipolar transistor to the base of the second bipolar transistor, to output another signal for putting the second bipolar transistor in an ON- or OFF-state in an opposite relation to the ON-OFF state of the first bipolar transistor; and a Schottky-barrier diode having an anode connected to the output terminal and a cathode connected to the base of the first bipolar transistor, for causing a current to flow from the output terminal to the base of the second bipolar transistor through the field effect transistor of the first conductivity type, and for blocking a current from the base of the first bipolar transistor to the output terminal.

In a further different point of view, the embodiment of FIG. 2 may be defined as a bipolar transistor-complementary field effect transistor composite circuit comprising: a first bipolar transistor having a collector of a first conductivity type connected to a first potential source, a base of a second conductivity type and an emitter of the first conductivity type connected to an output terminal; a second bipolar transistor having a collector of the first conductivity type connected to the output terminal, a base of the second conductivity type and an emitter of the first conductivity type connected to a second potential source; k input terminals (where $k \geq 1$); k first field effect transistors each having a channel of the second conductivity type, the gate electrode of each first field effect transistor being connected to a corresponding input terminal, each first field effect transistor being connected between the base and the collector of the first bipolar transistor in such a manner that, for $k \geq 2$, the first field effect transistors are connected in parallel or in series; k second field effect transistors each having a channel of the first conductivity type, the gate electrode of each second field effect transistor being connected to a corresponding input terminal, each second field effect transistor being connected between the base of the first bipolar transistor and the base of the second bipolar transistor in such a manner that, for $k \geq 2$, the second fielf effect transistors are connected in series or in parallel; a Schottky-barrier diode having an anode connected to the output terminal and a cathode connected to the base of the first bipolar transistor, for causing a current to flow from the output terminal to the base of the second bipolar transistor through the second field effect transistors and for blocking a current from the base of the first bipolar transistor to the output terminal; and discharge means for taking away the parasitic charge on the base of the second bipolar transistor.

Figure 3A:
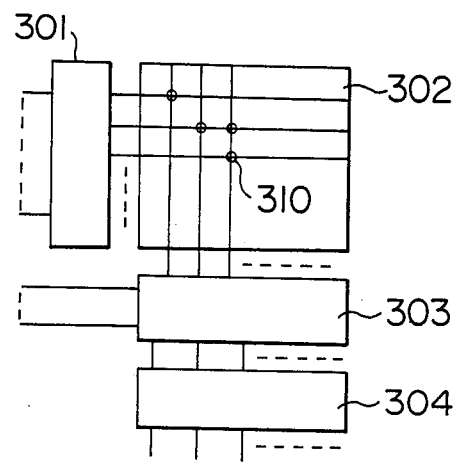
FIG. 3A is a schematic diagram showing an embodiment of a read only memory according to the present embodiment.
Figure 3B:
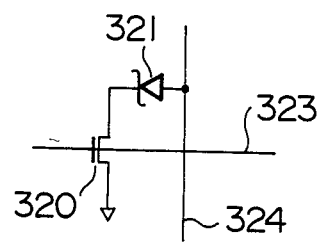
FIG. 3B is a circuit diagram showing the memory cell of FIG. 3A.

FIGS. 3A to 3B show an embodiment of a ROM (namely, read only memory) according to the present invention. Needless to say, the ROM is one of semiconductor matrix circuits.

In FIG. 3A, reference numeral 301 designates an X-decoder, 302 a ROM cell matrix, 303 a Y-decoder, 304 a sense amplifier, and 310 a ROM cell.

FIG. 3B is a circuit diagram showing the ROM cell 310 of FIG. 3A. In FIG. 3B, reference numeral 320 designates an NMOS transistor, 321 a Schottky diode, 323 a row line, and 324 a column line. The row line 323 corresponds to each of output lines of the X-decoder 301 shown in FIG. 3A, and the column line 324 corresponds to each of input lines of the Y-decoder 303 shown in FIG. 3A. The anode of the Schottky diode 321 is connected to the column line 324, and the gate electrode of the NMOS transistor 320 is connected to the row line 323. Further, the source electrode of the NMOS transistor 320 is grounded, and the cathode of the Schottky diode 321 is connected to the drain electrode of the NMOS transistor 320.

Figure 3C:
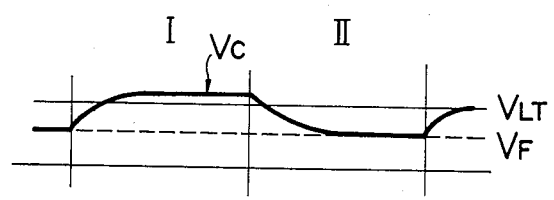
FIG. 3C is a waveform chart showing the operation of the memory cell of FIG. 3B.

The operation of the ROM cell having the above circuit configuration will be explained below, by reference to FIG. 3C. FIG. 3C shows the waveform of a voltage $V_C$ applied to the column line 324. In the first period I, the column line 324 is pre-charged by a pre-charge circuit (not shown), to a level "H" which is higher than the logical threshold voltage $V_{LT}$ of the sense amplifier 304. When the row line 323 is energized to the level "H", the second period II is started. That is, the parasitic capacitance with respect to the column line 324, which has charged up in the first period, discharges through the Schottky diode 321 and the NMOS transistor 320. Thus, the potential of the column line 324 is decreased. However, a forward voltage $V_F$ which is substantially constant, is applied across the Schottky diode 321, and hence the potential of the column line 324 is decreased to and kept at the forward voltage $V_F$ of the Schottky diode 321.

As is evident from the above explanation, according to the present embodiment, the voltage amplitude at the column line is suppressed, and thus power consumption of the ROM cell is reduced. Further, since the column line is pre-charged to a relatively low potential, a time necessary for pre-charging the column line can be shortened, and thus the access cycle can be increased.

Figure 4:
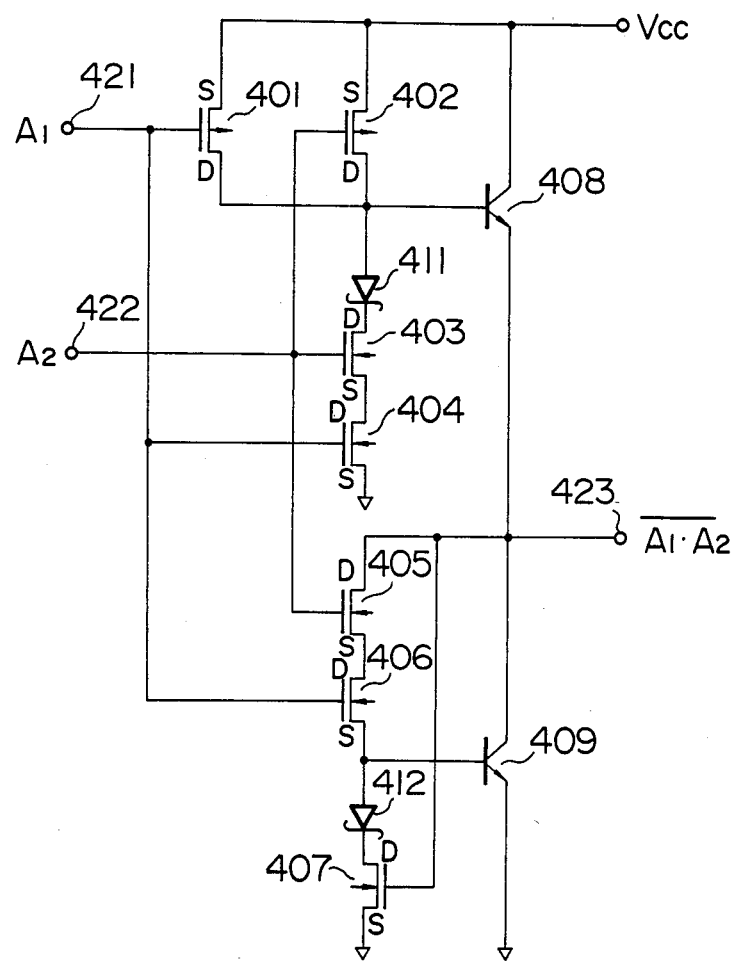
FIG. 4 is a circuit diagram showing another embodiment of a logic circuit according to the present invention.

FIG. 4 shows another embodiment of a logic circuit according to the present invention. The present embodiment is a two-input NAND gate circuit which is an example of a composite logic circuit including a bipolar transistor and a complementary MOS.

Referring to FIG. 4, the source electrodes of PMOS transistors 401 and 402 are connected to a power source $V_{CC}$, and the drain electrodes of the transistors 401 and 402 are connected to the base of an NPN transistor 408, to form the same PMOS transistor circuit as in the conventional two-input NAND gate circuit including a complementary MOS. The drain electrode of an NMOS transistor 403 is connected to the cathode of a Schottky diode 411, whose anode is connected to the base of the NPN transistor 408. The source electrode of he NMOS transistor 403 is connected to the drain electrode of an NMOS transistor 404, the source electrode of which is grounded. The NMOS transistors 403 and 404 act as a first base discharging element for taking away the electric charge on the base of the NPN transistor 408 at the time the NPN transistor 408 is changed from the ON-state to the OFF-state. The drain electrode of an NMOS transistor 405 is connected to an output terminal 423, and the source electrode of the transistor 405 is connected to the drain electrode of an NMOS transistor 406, the source electrode of which is connected to the base of an NPN transistor 409 and the anode of a Schottky diode 412. The NMOS transistors 405 and 406 form the same MNOS transistor circuit as in the conventional two-input NAND gate circuit including a complementary MOS. The cathode of the Schottky diode 412 is connected to the drain electrode of an NMOS transistor 407, the source electrode of which is grounded. The NMOS transistor 407 acts as a second base discharging element for taking away the electric charge on the base of the NPN transistor 409 at the time the transistor 490 is changed from the ON-state to the OFF-state. The collector of the NPN transistor 408 is connected to the power source $V_{CC}$, and the emitter of the transistor 408 is connected to the output terminal 423 and the collector of the NPN transistor 409, whose emitter is grounded.

Further, an input terminal 421 is connected to the gate electrodes of the PMOS transistor 401 and the NMOS transistors 404 and 406, and another input terminal 422 is connected to the gate electrodes of the PMOS transistor 402 and the NMOS transistors 403 and 405. Output terminal 423 is connected to the gate electrode of NMOS transistor 407.

Now, the operation of the present embodiment will be explained below. First, let us consider a case where at least one of input signals $A_1$ and $A_2$ takes a level "0". In this case, at least one of the NMOS transistors 403 and 404 is turned off, and at least one of the NMOS transistors 405 and 406 is turned off. Further, at least one of the PMOS transistors 401 and 402 is turned on. Accordingly, a base current is supplied to the base of the NPN transistor 408, and thus the transistor 408 is turned on. As a result, a load which is connected to the output terminal 423 but is not shown in FIG. 4, charges up, and thus an output signal takes a level "1". At this time, the NMOS transistor 407 is turned on, and the NPN transistor 409 is rapidly turned off, since the electric charge stored in the vicinity of the base of the NPN transistor 409 flows to the ground through the Schottky diode 412 and the NMOS transistor 407.

Next, let us consider a case where both of the input signals $A_1$ and $A_2$ take a level "1". In this case, the PMOS transistors 401 and 402 are both turned off, and the NMOS transistors 403 to 406 are all turned on. Accordingly, a base current flows from the output terminal 423 to the base of the NPN transistor 409 through the NMOS transistors 405 and 406, and thus the transistor 409 is turned on. As a result, the electric charge stored in the load flows to the ground through the NPN transistor 409, and thus the output signal takes a level "0". At the same time as the above operation, the parasitic capacitance existing in the vicinity of the base of the NPN transistor 408 discharges through the Schottky diode 411 and the NMOS transistors 403 and 404. Thus, the NPN transistor 408 is rapidly turned off.

The characteristic feature of the present embodiment resides in that each of the first and second base discharging circuits for removing the electric charge from the bases of the NPN transistors 408 and 409 is formed of the series combination of a Schottky diode and a MOS transistor. Accordingly, when the MOS transistor of each base discharging circuit is turned on, the potential of the base of the NPN transistor 408 or 409 is reduced not to the ground potential but to a potential which is higher than the ground potential by the forward voltage $V_F$ of the Schottky diode. As a result, an increase in base potential necessary for turning on the NPN transistors 408 and 409 is equal to $V_{BE}-V_F$. Accordingly, when the present embodiment is designed so as to satisfy, for example, a relation $V_F=0.5V_{BE}$, a time necessary for turning on each of the NPN transistors 408 and 409 will be about one-half of that required in the conventional two-input NAND circuit including a complementary MOS.

Although the present embodiment provides a two-input NAND circuit, the present invention is also applicable to multi-input NAND circuit having a number k of inputs, i.e. k-input NAND circuit such as a three-input NAND circuit and a four-input NAND circuit. In this case, k PMOS transistors such as the transistors 401 and 402 are connected in parallel, k NMOS transistors such as the transistors 403 and 404 are connected in series, k NMOS transistors such as the transistors 405 and 406 are connected in series, and the gate electrode of each PMOS transistor and the gate electrode of each NMOS transistor are connected to a corresponding one of k input terminals. Further, the present invention is not limited to the k-input NAMD circuit, but is applicable to a k-input NOR circuit or an inverter circuit. In the case of the k-input NOR circuit, k PMOS transistors such as the transistors 401 and 402 of FIG. 4 are connected in series, k NMOS transistors such as the transistors 403 and 404 are connected in parallel, and k NMOS transistors such as the transistors 405 and 406 are connected in parallel. In the case of the inverter circuit, one of the PMOS transistors 401 and 402, one of the NMOS transistors 403 and 404, and one of the NMOS transistors 405 and 406 in the circuit of FIG. 4 are omitted. In other words, the inverter circuit corresponds to the k-input NAND circuit or k-input NOR circuit in which the value of k is equal to one.

In a different point of view, the present embodiment of FIG. 4 is considered to be a bipolar transistor-complementary field effect transistor composite circuit comprising: a pair of first and second bipolar transistors each having a collector of a first conductivity type, a base of a second conductivity type and a collector of the first conductivity type, the bipolar transistors being connected in series between first and second potential sources, the connection node of the collector-emitter current paths of the bipolar transistors being used as an output terminal of the composite circuit; a first field effect transistor of the second conductivity type responsive to a predetermined input for forming a path from the first potential source to the base of the first bipolar transistor, to output a signal for putting the first bipolar transistor in an ON- or OFF-state; a second field effect transistor of the first conductivity type responsive to the predetermined input for forming a path from the output terminal to the base of the second bipolar transistor, to output another signal for putting the second bipolar transistor in an ON- or OFF-state in an opposite relation to the ON-OFF state of the first bipolar transistor; first discharge means for removing the parasitic charge on the base of the first bipolar transistor through a first Schottky-barrier diode; and second discharge means for removing the parasitic charge on the base of the second bipolar transistor through a second Schottky-barrier diode.

Preferably, the first discharge means of the above composite circuit includes a third field effect transistor of the first conductivity type responsive to the predetermined input for forming a path from the base of the first bipolar transistor to the second potential source through the first Schottky-barrier diode, when the first bipolar transistor is put in the OFF-state through the aid of the first Schottky-barrier diode.

Further, it is preferable that the second discharge means of the above composite circuit includes a fourth field effect transistor of the first conductivity type which is put in an ON-state when the first bipolar transistor is turned on, to form a current path from the base of the second bipolar transistor to the second potential source through the Schottky-barrier diode, and which is put in an OFF-state when the first bipolar transistor is turned off.

Preferably, the gate electrode of the fourth field effect transistor is connected to the output terminal, and the series combination of the fourth field effect transistor and the second Schottky-barrier diode is connected between the base of the second bipolar transistor and the second potential source.

In the above explanation, the gate electrode of the fourth field effect transistor is connected to the output terminal. Alternatively, the gate electrode of the fourth field effect transistor may be connected to the base of the first bipolar transistor.

Further, in another different point of view, the embodiment of FIG. 4 may be defined as a bipolar transistor-complementary field effect transistor composite circuit comprising: a first bipolar transistor having a collector of a first conductivity type connected to a first potential source, a base of a second conductivity type and an emitter of the first conductivity type connected to an output terminal; a second bipolar transistor having a collector of the first conductivity type connected to the output terminal, a base of the second conductivity type and an emitter of the first conductivity type connected to a second potential source; k input terminals (where $k \geq 1$); k first field effect transistors each having a channel of the second conductivity type, the gate electrode of each first field effect transistor being connected to a corresponding input terminal, each first field effect transistor being connected between the base and the collector of the first bipolar transistor in such a manner that, for $k \geq 2$, the first field effect transistors are connected in parallel or in series; k second field effect transistors each having a channel of the first conductivity type, the gate electrode of each second field effect transistor being connected to a corresponding input terminal, each second field effect transistor being connected between the output terminal and the base of the second bipolar transistor in such a manner that, for $k \geq 2$, the second field effect transistors are connected in series or in parallel; first discharge means for removing the parasitic charge on the base of the first bipolar transistor through a first Schottky-barrier diode; and second discharge means for removing the parasitic charge on the base of the second bipolar transistor through a second Schottky-barrier diode.

Preferably, the first discharge means of the above composite circuit includes k third field effect transistors, each of which has a channel of the first conductivity type and a gate electrode connected to a corresponding input terminal, and is connected between the base of the first bipolar transistor nd the second potential source through the first Schottky-barrier diode in such a manner that, for k≧2, the third field effect transistors are connected in series or in parallel.

Further, it is preferable that the second discharge means of the above composite circuit includes a fourth field effect transistor which has a channel of the first conductivity type, which is put in an ON-state when the first bipolar transistor is turned on, to form a current path from the base of the second bipolar transistor to the second potential source through the second Schottky-barrier diode, and which is put in an OFF-state when the first bipolar transistor is turned off.

Preferably, the gate electrode of the fourth field effect transistor is connected to the output terminal, and the series combination of the fourth field effect transistor and the second Schottky-barrier diode is connected between the base of the second bipolar transistor and the second potential source.

In the above explanation, the gate electrode of the fourth field effect transistor is connected to the output terminal. Alternatively, the gate electrode of the fourth field effect transistor may be connected to the base of the first bipolar transistor.

Figure 5A:
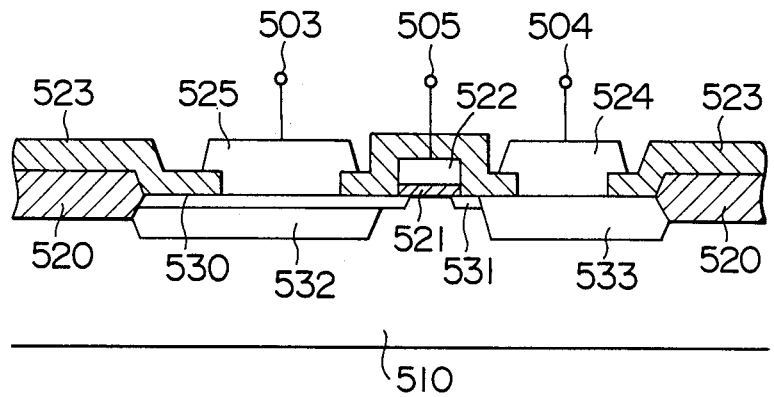
FIGS. 5A and 5B are a sectional view and a circuit diagram which show an embodiment of a switching circuit according to the present invention.
Figure 5B:
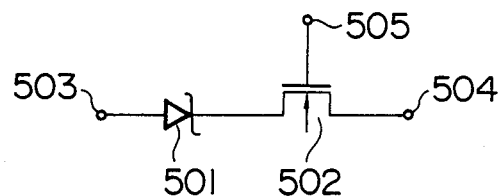

FIG. 5A shows an embodiment of a switching circuit which is included in a semiconductor integrated circuit and is formed in accordance with the present invention, and FIG. 5B shows the equivalent circuit of the embodiment of FIG. 5A.

In FIG. 5B, reference numeral 501 designates a Schottky diode, 502 an NMOS transistor, 503 an input terminal connected to the anode of the Schottky diode 501, 504 an output terminal connected to the source electrode of the NMOS transistor 502, and 505 a control terminal connected to the gate electrode of the transistor 502. The cathode of the Schottky diode 501 is connected to the drain electrode of the NMOS transistor 502. A semiconductor device for realizing the above circuit is shown in FIG. 5A.

In FIG. 5A, reference numeral 510 designates a P-type semiconductor substrate, 520 a field oxide film, 521 an oxide film for the gate of the NMOS transistor 502, 523 an inter-layer insulating film, 524 a first main electrode which is made of aluminum or others and is kept in ohmic contact with a source region 531 and 533, 525 a second main electrode which is made of aluminum or others and is kept in contact with an N-type region 530 included in a drain region, to form a Schottky barrier, 530 a lightly doped N-type region for forming the drain of the NMOS transistor 502 and the cathode of the Schottky diode 501, 531 a lightly-doped N-type region for forming the source of the NMOS transistor 502, 532 a highly-doped N+-buried layer having an impurity concentration greater than that of the N-type region 530, for reducing the resistance of the drain region, and 533 a highly-doped N+-layer having an impurity concentration greater than that of the N-type region 531, for reducing the resistance of the source region. The N-type regions 530 and 531 make up the so-called lightly-doped drain-source structure. Further, the highly-doped layers 532 and 533 can be formed, for example, by implanting high energy impurity ions into the N-type regions 530 and 531. The terminals 503, 504 and 505 of FIG. 5A designate the input terminal, the output terminal and the control terminal, respectively, as in FIG. 5B.

In the above-mentioned structure, the drain of the NMOS transistor 502 and the cathode of the Schottky diode 501 are both formed of the N-type layer 530. Accordingly, the present embodiment can be made for smaller in the area of switching element and the parasitic capacitance, as compared with a case where the NMOS transistor 502 and the Schottky diode 501 are formed independently of each other. In a case where the cathode resistance of the Schottky diode 501 and the drain resistance of the NMOS transistor 502 are negligibly small, the N+-buried layer 532 can be omitted.

Figure 6A:
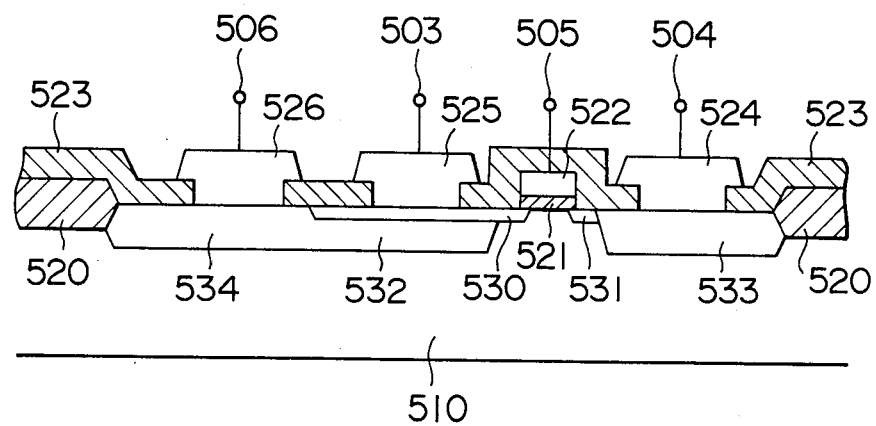
FIGS. 6A and 6B are a sectional view and a circuit diagram which show another embodiment of a switching circuit according to the present invention.
Figure 6B:
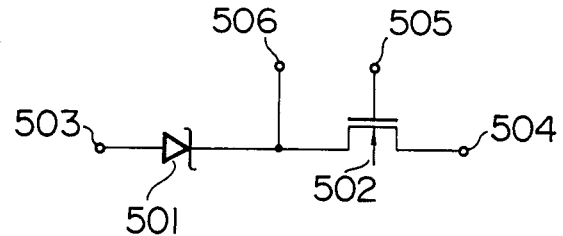

FIG. 6A shows another embodiment of a switching circuit which is included in a semiconductor integrated circuit and is formed in accordance with the present invention, and FIG. 6B shows the equivalent circuit of the embodiment of FIG. 6A. In FIGS. 6A and 6B, the same reference numerals as in FIGS. 5A and 5B designate like parts.

In FIG. 6B, reference numeral 506 designates the cathode terminal of the Schottky diode 501 or the drain terminal of the NMOS transistor 502. A semiconductor device for realizing the circuit of FIG. 6B is shown in FIG. 6A. Referring to FIG. 6A, the N+-burried layer 532 for reducing the drain resistance of the MOS transistor 502 is connected to an N+-layer 534, which has substantially the same inpurity concentration as the burried layer 532 and is kept in ohmic contact with a third main electrode 526. The electrode 526 is made of aluminum or others, and is connected to a terminal 506, which is used as the cathode terminal of the Schottky diode 501 or the drain terminal of the NMOS transistor 502. The N+-layer 533 on the source side of the NMOS transistor 502 and the N+-layer 534 are formed in the same manufacturing step.

According to the above structure, the degree of freedom in circuit design can be increased without lessening the effect of the present invention that not only the capacitance parasitic on the cathode of the Schottky diode 501 and the drain of the NMOS transistor 502 but also the area of switching element can be greatly reduced, as compared with a case where the Schottky diode and the NMOS transistor are formed independently of each other.

Next, an embodiment of a diode array which is one of semiconductor matrix circuits and is formed in accordance with the present invention, will be explained below, by reference to FIGS. 7A and 7B.

Figure 7A:
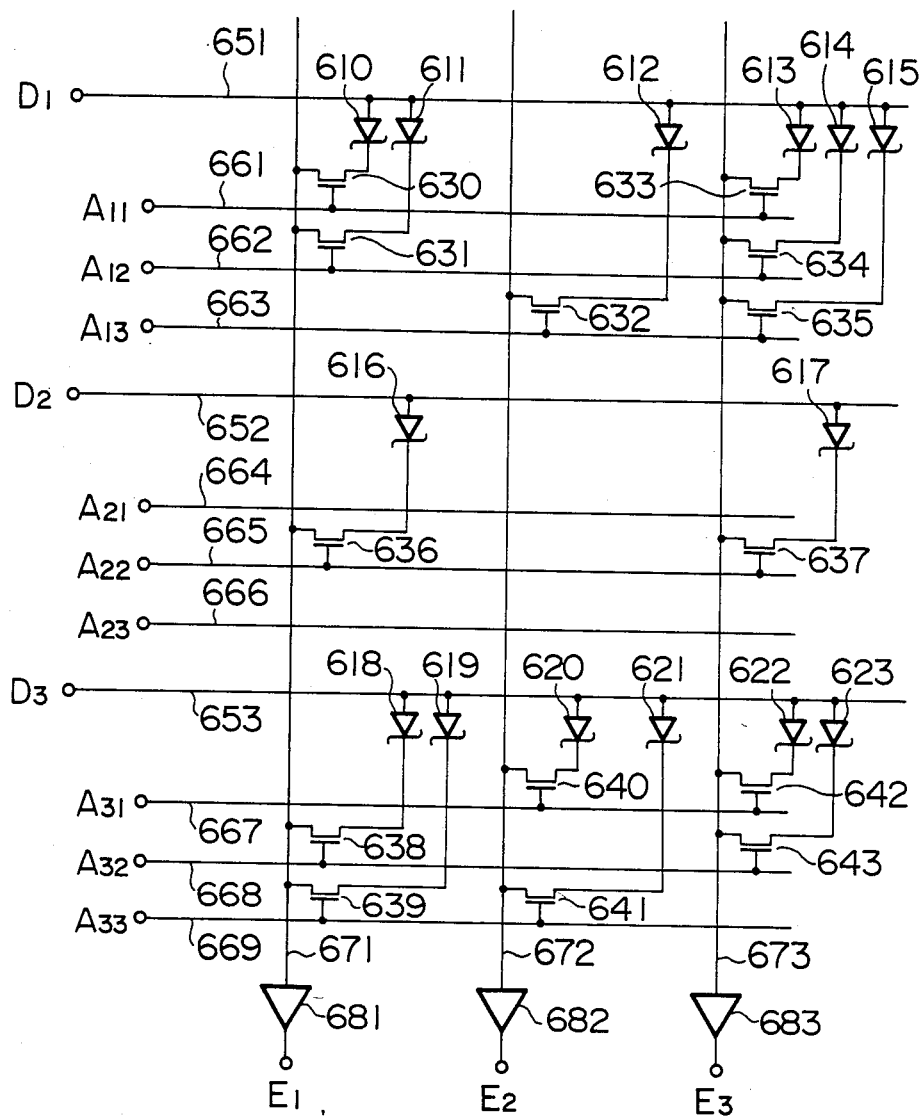
FIG. 7A is a circuit diagram showing an embodiment of a diode array according to the present invention.

FIG. 7A shows the circuit configuration of the present embodiment, and FIG. 7B is a truth table thereof. Referring to FIG. 7A, Schottky diodes 610 to 623 are connected in series with NMOS transistors 630 to 643, respectively, to form the same unidirectional switching circuits as shown in FIGS. 1 and 3. In FIG. 7A, reference numerals 651 to 653 designate row lines which serve as input lines, 661 to 669 row lines which serve as address lines, 671 to 673 column lines which serve as output lines, and 681 to 683 sense amplifiers. Further, in FIG. 7A, reference symbols $D_1$ to $D_3$ designate input signals, $A_{11}$ to $A_{33}$ address signals, and $E_1$ to $E_3$ output signals. Now, the operation of the present embodiment will be explained below. Let us consider a case where the input signal $D_1$ and the address signal $A_{11}$ take a level "H". In this case, the NMOS transistors 630 and 633 applied with the address signal $A_{11}$ are turned on, and other NMOS transistors are kept at an OFF-state. Accordingly, the input signal $D_1$ flows to the column line 671 through the Schottky diode 610 and the NMOS transistor 630, and also flows to the column line 673 through the Schottky diode 613 and the NMOS transistor 633. Thus, the output signals $E_1$ and $E_3$ take a level "1", but the output signal $E_2$ is kept at a level "0". That is, a current can flow through only those ones of switching circuits for connecting the row lines 651 to 653 to the column lines 671 to 673 where NMOS transistors are turned on by an address signal, and column lines connected to such switching circuits deliver output signals having the level "1". The truth table of FIG. 7B shows a relation among the input signals $D_1$ to $D_3$, the address signals $A_{11}$ to $A_{33}$, and the output signals $E_1$ to $E_3$. In order to operate the present embodiment, it is necessary to apply at least one of the input signals $D_1$ to $D_3$ to the present embodiment and to apply at least one of address signals corresponding to the applied input signal. In a case where two or more input signals are simultaneously applied to the present embodiment, the output of the embodiment is given by the logical sum of a plurality of output signals shown in FIG. 7B.

As is evident from the above explanation of the present embodiment, a diode array for variable logical processing can be formed by using a unidirectional switching circuit which is made up of a Schottky diode and a MOS transistor.

It is needless to say that a diode array which has a function similar to that of the present embodiment but is different in the number of input signals, output signals and address signals from the present embodiment, can be formed in accordance with the present invention. Further, a diode array including switching circuits each made up of a Schottky diode and a PMOS transistor has a function similar to that of the present embodiment.

As has been explained in the foregoing, according to the present invention, there are provided a unidirectional switching circuit which does not have the charge storage effect, and a logic circuit which can operate at a high speed.

Further, a switching circuit according to the present invention is only a little different in size from a single MOS transistor, and hence the integration density of the switching circuit at a large integration circuit can be greatly increased. Further, a switching circuit according to the present invention is small in parasitic capacitance because of the small size thereof, and hence is suitable for use in a circuit which is required to operate at a high speed.

We claim:

1. A semiconductor device having a first electrode, a second electrode, a unidirectional switching circuit connected between said first and second electrodes and a control electrode for controlling said unidirectional switching circuit, said unidirectional switching circuit comprising:

a field effect transistor including a first semiconductor region of a first conductivity type, second and third regions of a second conductivity type which are formed at a first surface of said first semiconductor region and spaced from each other, said second region being in ohmic contact with said first electrode, said third region being made in a two-layer form of a low-impurity concentration layer exposed to said first surface of said first semiconductor region and a buried layer buried into said first semiconductor region and having a higher concentration of impurities than that of said low-impurity concentration layer, and a gate electrode facing an area of said first surface of said first semiconductor region disposed between said second and third regions having an insulating layer formed between said area and said gate electrode, said gate electrode being connected to said control electrode; and a Schottky-barrier diode including said low-impurity concentration layer and said second electrode which is formed of metallic material, said second electrode being in contact with said low-impurity concentration layer so as to provide a Schottky barrier effect therebetween.

2. A semiconductor matrix circuit having a plurality of row lines, a plurality of column lines, unidirectional switching circuits formed at selected ones of respective intersections of said row lines and said column lines, and a plurality of input lines formed correspondingly to said row lines, each unidirectional switching circuit comprising:

a field effect transistor including a first semiconductor region of a first conductivity type, second and third regions of a second conductivity type which are formed at a first surface of said first semiconductor region and spaced from each other, said second region being in ohmic contact with a row line passing through an associated intersection, said third region being made in a two-layer form of a low-impurity concentration layer exposed to said first surface of said first semiconductor region and a buried layer buried into said first semiconductor region and having a higher concentration of impurities than that of said low-impurity concentration layer, and a gate electrode facing an area of said first surface of said first semiconductor region disposed between said second and third regions having an insulating layer formed between said area and said gate electrode, said gate electrode being connected to an input line corresponding to said row line passing through said associated intersection, and a Schottky-barrier diode including said low-impurity concentration layer and said second electrode which is formed of metallic material said second electrode being in contact with said low-impurity concentration layer so as to provide a Schottky-barrier effect therebetween, said second electrode being connected to a column line passing through said associated intersection.

* * * * *